United States Patent
Chen et al.

(10) Patent No.: US 8,542,532 B2
(45) Date of Patent: Sep. 24, 2013

(54) MEMORY ACCESS METHOD AND FLASH MEMORY USING THE SAME

(75) Inventors: Chung-Kuang Chen, Hsinchu (TW); Shuo-Nan Hung, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 145 days.

(21) Appl. No.: 13/298,443

(22) Filed: Nov. 17, 2011

(65) Prior Publication Data

US 2013/0128670 A1     May 23, 2013

(51) Int. Cl.
 *G11C 11/34* (2006.01)
(52) U.S. Cl.
 USPC ............. 365/185.18; 365/185.17; 365/185.23
(58) Field of Classification Search
 USPC ............. 365/185.02, 185.11, 185.17, 185.18, 365/185.23, 185.24, 185.29
 See application file for complete search history.

(56) References Cited

U.S. PATENT DOCUMENTS

| | | | |
|---|---|---|---|
| 2004/0145024 A1* | 7/2004 | Chen et al. | 257/390 |
| 2011/0149659 A1* | 6/2011 | Goda et al. | 365/185.19 |
| 2011/0170353 A1* | 7/2011 | Nguyen | 365/185.18 |

* cited by examiner

Primary Examiner — Son Dinh
Assistant Examiner — Hien Nguyen
(74) Attorney, Agent, or Firm — McClure, Qualey & Rodack, LLP

(57) ABSTRACT

A memory access method is applied in a memory controller for accessing an NAND memory array, including a number of respective select switches globally controlled with a string select signal. The memory access method includes the following steps. A stream bias signal and a selected word line signal are respectively provided on a selected stream and on a selected cell of the selected stream, and the rest of memory cells are turned on as pass transistors, in the setup phase. A discharge path is provided to eliminate coupling charge presented on unselected streams, in the setup phase. Then, the string select signal is enabled to have the selected stream connected to a sense unit via a metal bit line and according read the selected cell in a voltage sensing scheme, in a read phase, which does not overlap with the setup phase.

8 Claims, 4 Drawing Sheets

MEMORY ACCESS METHOD AND FLASH MEMORY USING THE SAME

BACKGROUND OF THE INVENTION

1. Field of the Invention

The invention relates in general to a memory access method, and more particularly to a memory access method applied on a flash memory array.

2. Description of the Related Art

In the present age, non-volatile memory devices have become more popular for use in various electronic devices. For example, flash memory is one of the most popular non-volatile semiconductor memories applied in the present age. Generally, flash memory includes flash memory cells with programmable threshold voltages, so that each of the flash memory cells can be programmed to indicate at least one bit of data.

With the demands for flash memories with higher storage volume, flash memory arrays with three-dimensional structures have be developed. However, conventional memory access method generally surfers from access inaccuracy issues. Consequently, how to provide a memory access method capable of remedy the inaccuracy issues has became still a prominent object for the industries.

SUMMARY OF THE INVENTION

The invention is directed to memory access method, applied in a memory controller for accessing an NAND memory array, in which memory cells are arranged into a number of streams globally controlled with a string select signal. The memory access method directed to by the invention firstly determines a selected cell of a selected stream by means of supplying stream bias signal and selected word line signal in a setup phase, wherein the memory access method further has rest of memory cells of the NAND memory array biased and turned on as pass transistors in the setup phase. The memory access method directed to by the invention then provides a discharge path connected to the streams to accordingly eliminate coupling charge presented on at least an unselected stream among the streams before the memory access method actually reads the selected cell. Thus, in comparison to conventional memory access method, the memory access method directed to by the invention is advantageously capable of eliminating the coupling charge on the at least a unselected stream, preventing the coupling charge from influencing the access operation of the selected cell, and achieving memory access with higher accuracy.

According to a first aspect of the present invention, a memory access method, applied in a memory controller for accessing an NAND memory array, in which memory cells are arranged into a number of streams globally controlled with a string select signal, is provided. The memory access method includes the following steps. Firstly, a stream bias signal is provided on a selected stream among the streams and a selected word line signal is provided on a selected cell of the selected stream, in a setup phase. Besides, a number of unselected word line signals are provided on the rest of memory cells, to have the rest of memory cells turned on as pass transistors, in the setup phase. Then a discharge path connected to the plurality of streams is provided to accordingly eliminate coupling charge presented on at least an unselected stream among the plurality of streams, in the setup phase. After that, the string select signal is enabled to have the selected stream connected to a sense unit via a metal bit line and according read the selected cell in a voltage sensing scheme, in a read phase, which does not overlap with the setup phase.

According to a second aspect of the invention, a flash memory is provided. The flash memory includes a sense unit, an NAND memory array and a memory controller. The NAND memory array includes a number of memory cells, wherein the memory cells are arranged into a number of streams, globally controlled with a string select signal. The memory controller is coupled to the NAND memory array for determining a setup phase and a read phase, which does not overlap with the setup phase. The memory controller provides a stream bias signal on a selected stream among the streams and provides a selected word line signal on a selected cell of the selected stream, in a setup phase. The memory controller further provides a number of unselected word line signals on the rest of memory cells, to have the rest of memory cells turned on as pass transistors, in the setup phase. The memory controller further provides a discharge path connected to the streams to accordingly eliminate coupling charge presented on at least an unselected stream among the streams, in the setup phase. The memory controller further enables the string select signal to have the selected stream connected to the sense unit via a metal bit line and according read the selected cell in a voltage sensing scheme, in the read phase.

The invention will become apparent from the following detailed description of the preferred but non-limiting embodiments. The following description is made with reference to the accompanying drawings.

DETAILED DESCRIPTION OF THE INVENTION

The memory access method according to the present embodiment of the invention provides a discharge path for eliminating coupling charge presented on the unselected streams, and accordingly achieving access operation of a selected cell, situated on a selected stream, with higher accuracy.

Figure 1:
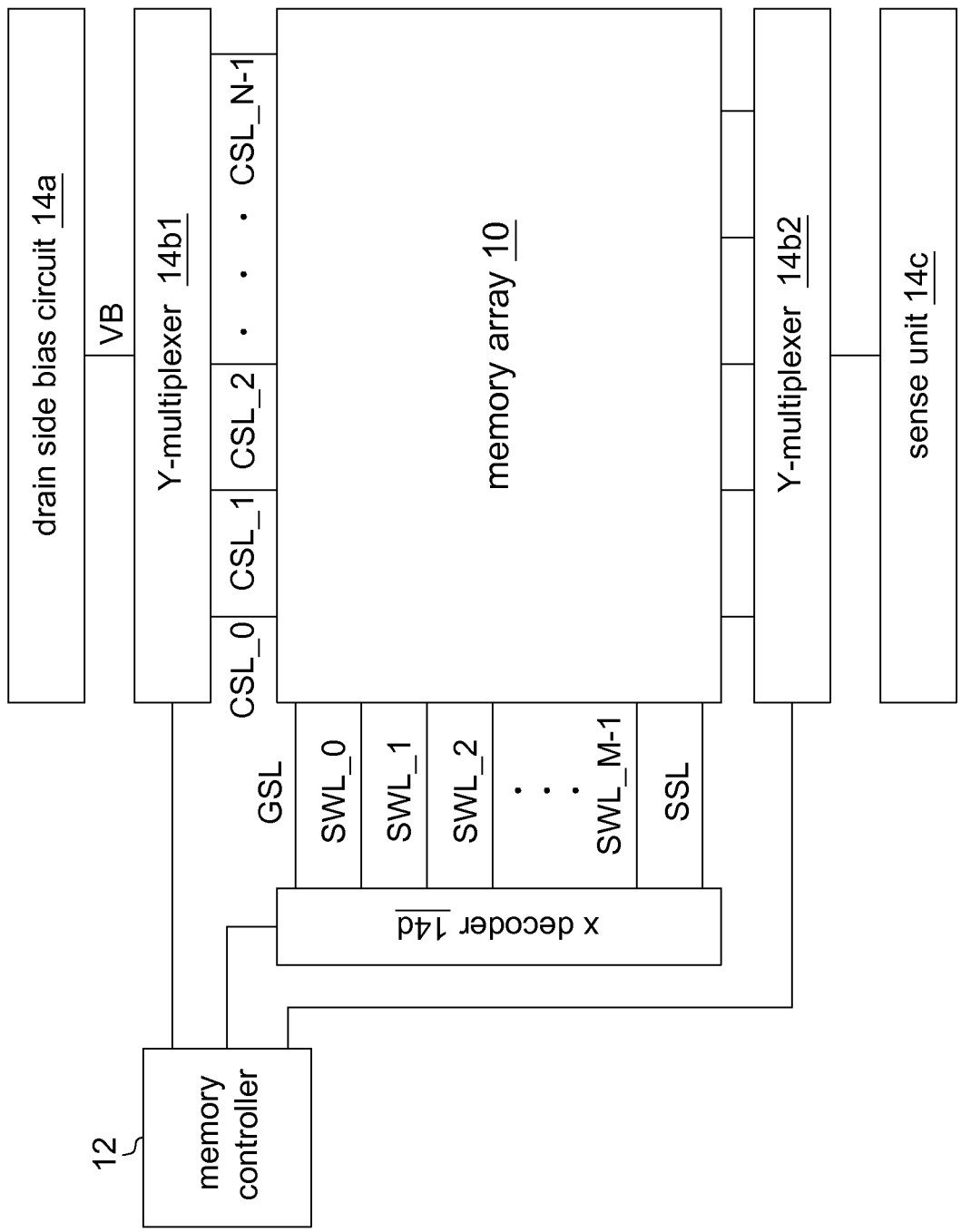
FIG. 1 is a circuit diagram of a flash memory according to an embodiment of the invention.

Referring to FIG. 1, a circuit diagram of a flash memory according to an embodiment of the invention is shown. The flash memory 1 includes a memory array 10, a memory accessing circuit, and a memory controller 12. For example, the memory array 10 is a three-dimensional NAND memory array, which includes a number of memory cells, wherein parts of the memory cells are arranged into a number of streams, globally connected to a same metal bit line through respective a same number of string select switches.

Figure 2:
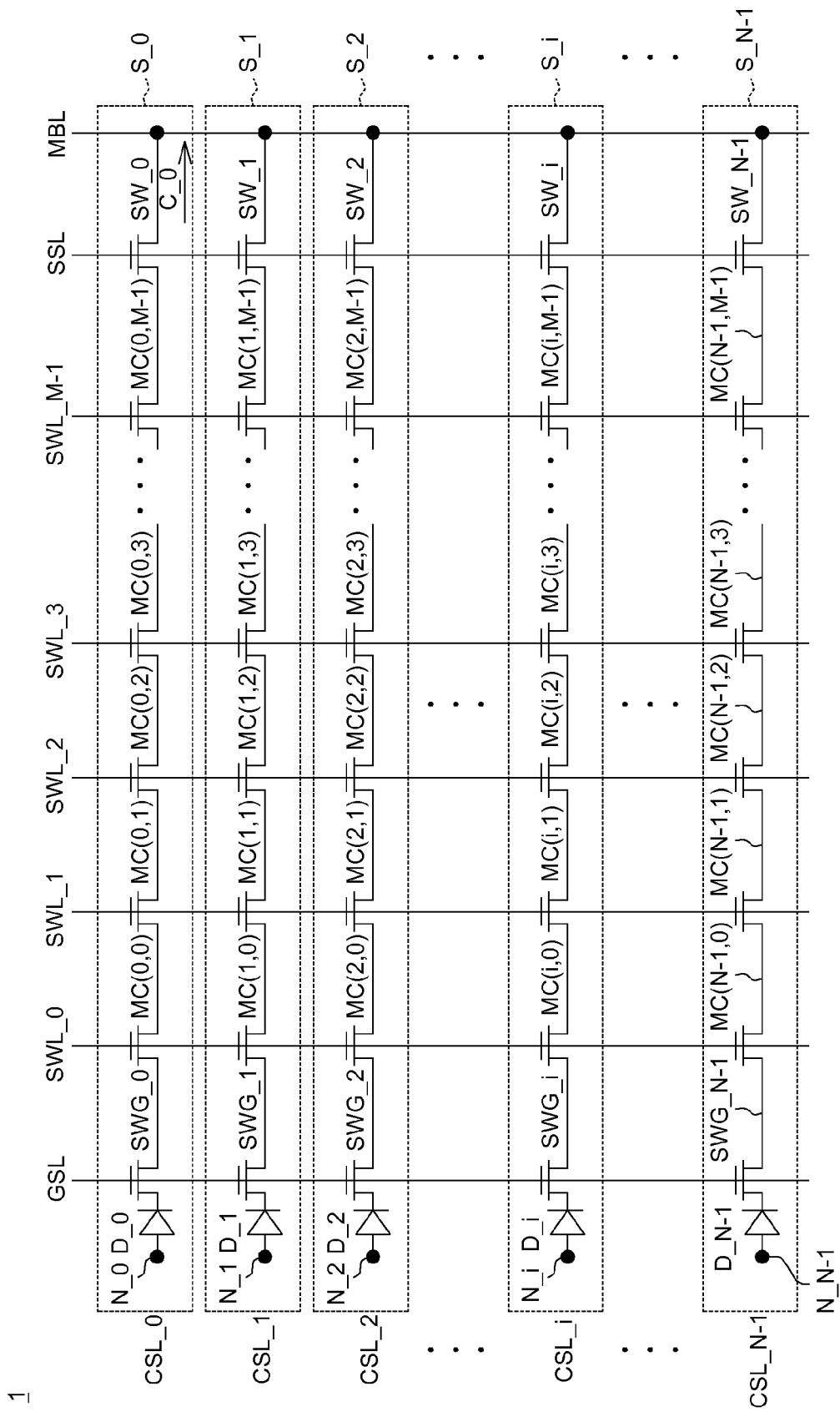
FIG. 2 is a circuit diagram of a subarea of the memory array 10.

Referring to FIG. 2, a circuit diagram of a subarea of the memory array 10 is shown. For example, the memory array 10 includes a metal bit line MBL, which is employed for accessing N streams S_0, S_1, S_2, . . . and S_N−1, wherein N is a natural number greater than 1. Since the N streams S_1 to S_N−1 have substantially the same circuit structure, the $i^{th}$ stream S_i is employed as an example for having the N streams S_0 to S_N−1 illustrated more specifically, wherein i is an integer greater than or equal to 0 and smaller than N.

The streams S_i includes M memory cells MC(i,0), MC(i,1), MC(i,2), . . . , and MC(i,M−1), a string select switch SW_i, a ground select switch SWG_i, a PN diode D_i, and a node N_i, wherein the string select switch SW_i and the ground select switch SWG_i are implemented as metal oxide semiconductor (MOS) transistors, and the memory cells MC(i,0) to MC(i,M−1) are implemented was MOS transistors with programmable threshold voltage. The source side and the drain side of the string select switch SW_i are respectively connected to the metal bit line MBL and the source side of the memory cell MC(i,M−1). The P end and the N end of the PN diode D_i are respectively connected to the node N_i and the drain side of the ground select switch SWG_i. The source side of the ground select switch SWG_i is connected to the drain side of the memory cell MC(i,0). The memory cells MC(i,1) to MC(i,M−2) are serially connected between the source end of the memory cell MC(i,0) and the drain end of the memory cells MC(i,M−1).

The control ends of the string select switches SW_0 to SW_N−1, respectively corresponding to the streams S_0 to S_N−1, receive a string select signal SSL, which is employed for globally controlling the operations of the string select switches SW_0 to SW_N−1. The control ends of the ground select switches SWG_0 to SWG_N−1 receive a ground select signal GSL, which are employed for globally controlling the operations of the ground select switches SWG_0 to SWG_N−1. The control ends of memory cells corresponding to a same row position receive a same word line signal, and are thus globally controlled with the same word line signal. For example, the memory cells MC(0,0), MC(1,0), MC(2,0), . . . , and MC(N−1,0) correspond to the row position of 0, and are globally controlled with the word line signal SWL_0.

Referring back to FIG. 1. The accessing circuit is connected to the memory array 10 and the memory controller 12, and is controlled by the memory controller 12 to access the memory array 10. For example, the accessing circuit includes a drain side bias circuit 14a, Y-multiplexers 14b1, 14b2, sense unit 14c, and x-decoder 14d. The drain side bias circuit 14a provides a stream bias voltage VB to the Y-multiplexer 14b1. For example, the memory array 10 is operated in a reverse read scheme, and the stream bias voltage VB is a high level voltage, e.g. greater than a ground voltage GND. The Y-multiplexer 14b1 is controlled by the memory controller 12 to provide stream bias signals CSL_0 to CSL_N−1, wherein one the stream bias signals CSL_0 to CSL_N−1 corresponds to the stream bias voltage VB for accordingly having the corresponding one of the corresponding streams S_0 to S_N−1 chosen as a selected stream, while the other N−1 stream bias signals CSL_0 to CSL_N−1 correspond the ground voltage GND. In an example, the stream bias signal CSL_0 corresponds to the stream bias voltage VB, while the other stream bias signals CSL_1 to CSL_N−1 correspond to the ground voltage GND. Thus, the stream S_0 is accordingly chosen as the selected stream.

The X-decoder 14d is controlled by the memory controller 12 to provide the string select signal SSL, the ground select signal GSL, and the word line signals SWL_0 to SWL_M−1. For example, one of the word line signals SWL_0 to SWL_M−1 corresponds to a selected word line voltage VS, for reading a selected cell on the selected stream, while the other word line signals SWL_0 to SWL_M−1 correspond to a pass word line voltage VP, for having the rest memory cells of the memory array 10 biased as pass transistors. In an example, the word line signal SWL_0 corresponds to the selected word line voltage VS, while the other word line signals SWL_1 to SWL_M−1 correspond to the pass word line voltage VP. In other words, the memory cell, within the selected stream S_0 and further corresponding to the row position of 0, is chosen as the selected cell.

For example, the level of the selected word line voltage VS is determined with respect to the threshold voltage of the memory cells MC(0,0) to MC(N−1,M−1) of the memory array 10. In an embodiment, the threshold voltages of the memory cells MC(0,0) to MC(N−1,M−1) are greater than the ground voltage GND, and the selected word line voltage VS is accordingly set with a level greater than the ground voltage GND. In other embodiment, the threshold voltage of the memory cells MC(0,0) to MC(N−1,M−1) are substantially equal to the ground voltage GND, and the selected word line voltage VS is accordingly set to the ground voltage GND. In the present embodiment, only the situation that the threshold voltages of the memory cells MC(0,0) to MC(N−1,M−1) are greater than the ground voltage GND, i.e. the selected word line voltage VS is greater than the ground voltage GND, is illustrated, while the situation that threshold voltages of the memory cells MC(0,0) to MC(N−1,M−1) substantially equal the ground voltage GND can be inferred accordingly.

The Y-multiplexer 14b2 is controlled by the memory controller 12 to provide the stream current C_0, e.g. the cell current of the selected cell MC(0,0), flowed on the metal bit line MBL to the sense unit 14c, so that the data value corresponding to the selected cell can be accordingly obtained. For example, the sense unit 14c employs a voltage sensing scheme to have the data value of the selected cell obtained.

The memory controller 12 is coupled to the memory array 10 via the accessing circuit, and accordingly achieves the access operation of the selected cell on the selected stream. In an example, the memory controller 12 is implemented as a state machine within the flash memory 1. In the following paragraphs, examples for accessing the selected cell, e.g. the memory cell MC(0,0), are cited to more specifically illustrate the timing control operations of the memory controller 12.

Figure 3:
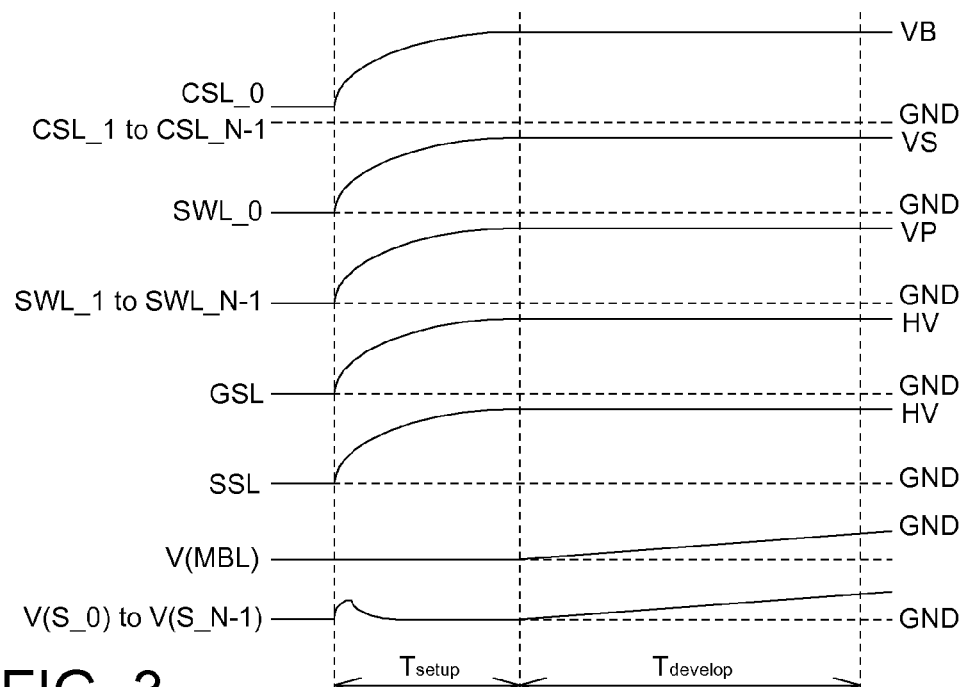
FIG. 3 is a timing diagram of the related signals shown in FIG. 2.

Referring to FIG. 3, a timing diagram of the related signals shown in FIG. 2. The memory controller 12 determines a setup phase $T_{setup}$ and a read phase $T_{develop}$, wherein the setup phase $T_{setup}$ and the read phase $T_{develop}$ do not overlap with each other.

In the setup phase $T_{setup}$, the memory controller 12 drives the Y-multiplexer 14b1 to provides the stream bias signals CSL_0 to CSL_N−1, wherein the stream bias signal CSL_0 corresponds to the stream bias voltage VB, while the stream bias signals CSL_1 to CSL_N−1 correspond to the ground voltage GND. Besides, the memory controller 12 further drives the x-decoder 14d to have the word line signal SWL_0 biased to the selected word line voltage VS, and have the word line signals SWL_1 to SWL_N−1 biased to the pass word line voltage VP. Thus, the selected cell, e.g. the memory cell MC(0,0), on the selected stream S_0 is accordingly determined, and the rest of memory cells are turned on as pass transistors.

Furthermore, the string select signal SSL and the ground select signal GSL are also raised to a high voltage HV, e.g. higher than the ground voltage GND, in the setup phase $T_{setup}$. Thus, the selected stream S_0 is substantially biased as a pass transistor string in the setup phase $T_{setup}$.

On the contrary, the PN diodes D_1 to D_N−1 on the unselected streams S_1 to S_N−1 are turned off in the setup phase $T_{setup}$ due to the grounded stream bias signals CLS_1 to CSL_N−1. Thus, before the string select signal SSL is raised high enough to turn on the string select switches SW_1 to SW_N−1, the unselected streams S_1 to S_N−1 are substantially floating, wherein each of the unselected streams S_1 to S_N−1 substantially forms a huge capacitor, with one side of it receiving the word line signals SWL_1 to SWL_M−1 and the other side of it floating. What is even worse is that the word line signals SWL_0 to SWL_M−1 are simultaneously boosted up to the stream bias voltage VB or the pass word line voltage VP in the setup phase $T_{setup}$. Consequently, the steam voltages V(S_0) to V(S_N−1), e.g. the voltages at source or drain of any of the memory cells in the floating unselected streams S_1 to S_N−1 and the voltage at source or drain of the memory cells in the selected stream S_0, are also boosted up due to the capacitance coupling effect.

In order to eliminate the unwanted voltage boost of the stream voltages V(S_0) to V(S_N−1) due to the capacitance coupling effect, the string select signal SSL is also raised to the high voltage HV in the setup phase $T_{setup}$, to have the string select switches SW_1 to SW_N−1 turned on. Thus, a discharge path, formed with the metal bit line MBL and the sense unit 14c, connected to the streams S_0 to S_N−1 is provided to accordingly have the stream voltages V(S_0) to V(S_N−1) pulled down to the ground voltage GND, and eliminate the coupling charge presented thereon in the setup phase $T_{setup}$.

In the read phase $T_{develop}$, the metal bit line MBL is floating, and the memory controller 12 keeps providing the enabled string select signal SSL, so that the cell current of the selected cell MC(0,0) can be provided to have capacitance presented on the metal bit line MBL charged, and the voltage of the metal bit line MBL V(MBL) rises accordingly. The memory controller 12 further drives the sense unit 14c to sense the voltage V(MBL), and accordingly achieves the access operation of the selected cell MC(0,0).

Based on the above, the memory access method according to the present embodiment is able to eliminate the unwanted charge, presented in the unselected streams S_1 to S_N−1, via the discharge path in the setup phase $T_{setup}$, so that the cell current of the selected cell MC(0,0) obtained in the read phase $T_{develop}$ is substantially free from the interferences caused by the unselected streams S_1 to S_N−1. Consequently, the cell current can be employed to accurately determine the data value stored in the selected cell MC(0,0).

Figure 4:
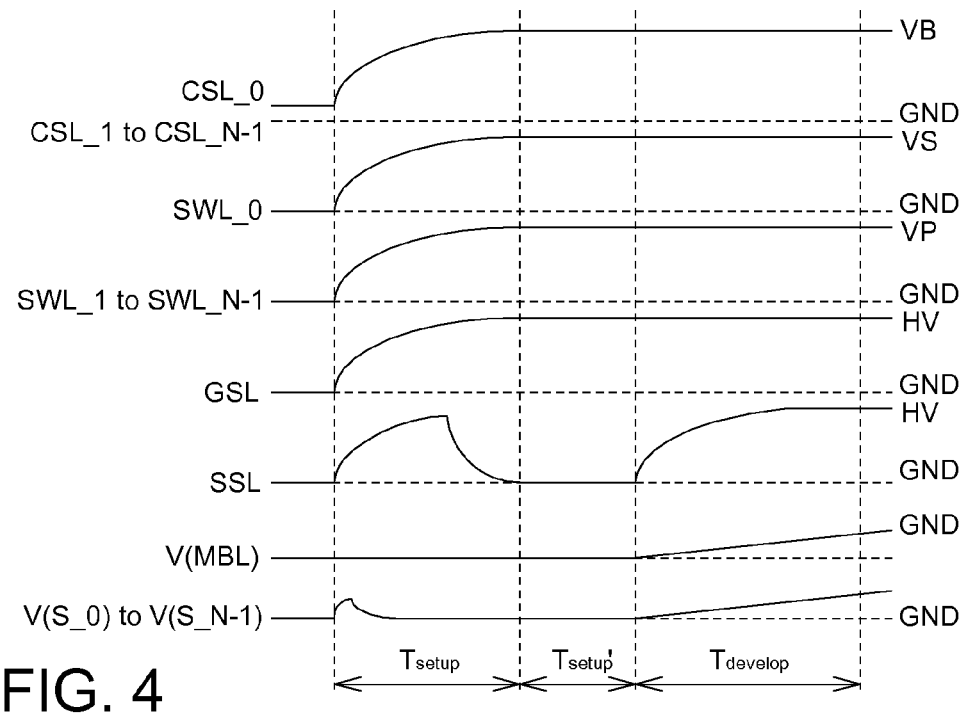
FIG. 4 is another timing diagram of the related signals shown in FIG. 2.

Though only the situation that the memory controller 12 determines two phases, e.g. the setup phase $T_{setup}$ and the read phase $T_{develop}$, and accordingly operates therein has been illustrated in the present embodiment, the memory controller 12 is not limited thereto. In other example, the memory controller 12 further determines a second setup phase $T_{setup'}$, in which page buffer within the sense unit 14c is set and the metal bit line MBL is biased, as depicted in FIG. 4. For example, the string select signal SSL is pulled to the ground voltage GND before the second setup phase $T_{setup'}$, so that the string select switches SW_0 to SW_N−1 are turned off and the metal bit line MBL and the page buffer can be biased and set.

Figure 5:
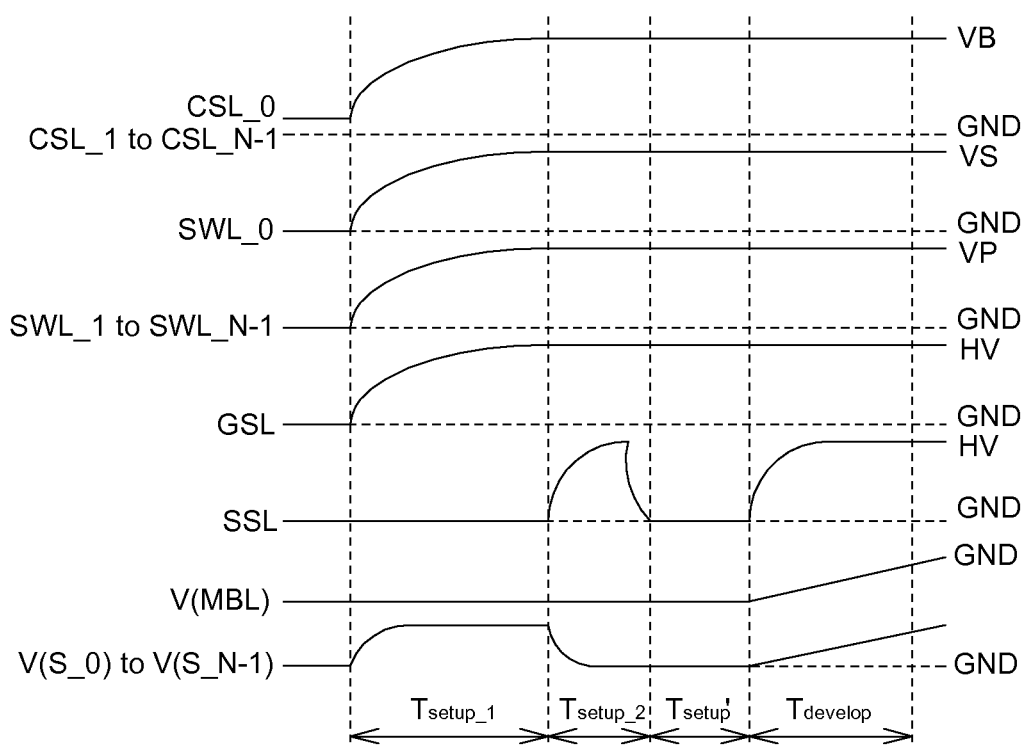
FIG. 5 is still another timing diagram of the related signals shown in FIG. 2.

In still another example, the memory controller 12 further determines a first sub-phase $T_{setup\_1}$ and a second sub-phase $T_{setup\_2}$ within the setup phase $T_{setup}$, as depicted in FIG. 5. In the first sub-phase $T_{setup\_1}$, the memory controller 12 provides the stream bias signals CSL_0 to CSL_N−1 and the word line signals SWL_0 to SWL_N−1. In the second sub-phase $T_{setup\_2}$, the memory controller 12 provides the discharge path by means of enabling the string select signal SSL. In other words, the memory controller 12 executes the operation of eliminating the unwanted charge presented on the unselected streams S_1 to S_N−1 after the operations of providing the stream bias signals CSL_0 to CSL_N−1 and the word line signals SWL_0 to SWL_N−1.

The memory access method and the memory controller according to the present embodiment of the invention are employed for accessing an NAND memory array, in which memory cells are arranged into a number of streams, including a number of respective select switches globally controlled with a string select signal. The memory access method according to the present embodiment firstly determines a selected cell of a selected stream by means of supplying stream bias signal and selected word line signal in a setup phase, wherein the memory access method further has rest of memory cells of the NAND memory array biased and turned on as pass transistors in the setup phase. The memory access method according to the present embodiment then provides a discharge path connected to the number of streams to accordingly eliminate coupling charge presented on at least an unselected stream among the number of streams before the memory access method actually reads the selected cell. Thus, in comparison to conventional memory access method, the memory access method and the memory controller according to the present embodiment are advantageously capable of eliminating the coupling charge on the at least a unselected stream, preventing the coupling charge from influencing the access operation of the selected cell, and achieving memory access with higher accuracy.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory access method, applied in a memory controller for accessing an NAND memory array, in which memory cells are arranged into a plurality of streams, which are globally controlled with a string select signal, the memory access method comprising:
   providing a stream bias signal on a selected stream among the plurality of streams and providing a selected word line signal on a selected cell of the selected stream, in a setup phase;
   providing a plurality of unselected word line signals on the rest of memory cells, to have the rest of memory cells turned on as pass transistors, in the setup phase;
   providing a discharge path connected to the plurality of streams to accordingly eliminate coupling charge presented on at least an unselected stream among the plurality of streams, in the setup phase; and
   enabling the string select signal to have the selected stream connected to a sense unit via a metal bit line and accordingly read the selected cell in a voltage sensing scheme, in a read phase, which does not overlap with the setup phase.

2. The memory access method according to claim 1, wherein step of providing the discharge path further comprises:
   enabling the string select signal to have the plurality of streams globally connected to the metal bit line and have the at least an unselected stream discharged via the metal bit line.

3. The memory access method according to claim 1, further comprising:
   determining a first sub-phase within the setup phase, wherein, the step of providing the stream bias signal and the selected word line signal and the step of providing the plurality of unselected word line signals are both executed in the first sub-phase.

4. The memory access method according to claim 3, further comprising:

determining a second sub-phase within the setup phase, wherein, the step of providing the discharge path is executed in the second sub-phase.

5. A flash memory, comprising:

a sense unit;

an NAND memory array, comprising a plurality of memory cells, wherein the memory cells are arranged into a plurality of streams, which are globally controlled with a string select signal; and a memory controller, coupled to the NAND memory array, the memory controller further determining a setup phase and a read phase, which does not overlap with the setup phase, wherein, the memory controller provides a stream bias signal on a selected stream among the plurality of streams and provides a selected word line signal on a selected cell of the selected stream, in a setup phase;

the memory controller further provides a plurality of unselected word line signals on the rest of memory cells, to have the rest of memory cells turned on as pass transistors, in the setup phase;

the memory controller further provides a discharge path connected to the plurality of streams to accordingly eliminate coupling charge presented on at least an unselected stream among the plurality of streams, in the setup phase; and the memory controller further enables the string select signal to have the selected stream connected to the sense unit via a metal bit line, so that the sense unit accordingly reads the selected cell in a voltage sensing scheme, in the read phase.

6. The flash memory according to claim 5, wherein the memory controller enables the string select signal to have the plurality of streams globally connected to the metal bit line, and have the at least an unselected stream discharged via the metal bit line, to accordingly provide the discharge path.

7. The flash memory according to claim 5, wherein the memory controller further determines a first sub-phase within the setup phase, and the memory controller provides the stream bias signal, the selected word line signal, and the plurality of unselected word line signals in the first sub-phase.

8. The flash memory according to claim 7, wherein the memory controller further determines a second sub-phase within the setup phase, wherein the memory controller provides the discharge path in the second sub-phase.

* * * * *